United States Patent [19]
Candelaria

[11] Patent Number: 5,561,302
[45] Date of Patent: Oct. 1, 1996

[54] ENHANCED MOBILITY MOSFET DEVICE AND METHOD

[75] Inventor: Jon J. Candelaria, Tempe, Ariz.

[73] Assignee: Motorola, Inc., Schaumburg, Ill.

[21] Appl. No.: 311,979

[22] Filed: Sep. 26, 1994

[51] Int. Cl.⁶ .................................................. H01L 29/06
[52] U.S. Cl. ............................ 257/24; 257/77; 257/190; 257/212
[58] Field of Search ................................ 257/77, 20, 24, 257/19, 27, 212, 192, 190

[56] References Cited

U.S. PATENT DOCUMENTS

| | | |
|---|---|---|
| 4,994,866 | 2/1991 | Awano . |
| 5,019,882 | 5/1991 | Solomon et al. . |
| 5,036,374 | 7/1991 | Shimbo ................................ 257/24 |
| 5,055,887 | 10/1991 | Yamazaki ............................ 257/20 |
| 5,155,571 | 10/1992 | Wang et al. . |
| 5,227,644 | 7/1993 | Ueno . |
| 5,241,197 | 8/1993 | Murakami et al. .................. 257/192 |
| 5,272,365 | 12/1993 | Nakagawa . |
| 5,360,986 | 11/1994 | Candelaria ......................... 257/183 |

FOREIGN PATENT DOCUMENTS

| | | |
|---|---|---|
| 63-308966 | 12/1988 | Japan . |
| 5-90602 | 4/1993 | Japan ..................................... 257/77 |

OTHER PUBLICATIONS

Demkov et al., "Theoretical investigation of random Si–C alloys", *The American Physical Society*, vol. 48, No. 4, Jul. 1993, pp. 2207–2214.

Sze, *Semiconductor Devices: Physics and Technology*, 1985, pp. 328–329.

R. People et al., Band Alignments of coherently strained $Ge_x Si_{1-x}$/ Si heterostructures on <001> $Ge_y Si_{1-y}$ Substrates, Appl. Phys. Lett. vol. 48, No. 8, 24 Feb. 1986, pp. 538–540.

*Primary Examiner*—Sara W. Crane
*Assistant Examiner*—Courtney A. Bowers
*Attorney, Agent, or Firm*—Kevin B. Jackson

[57] ABSTRACT

An enhanced mobility MOSFET device (10) comprises a channel layer (12) formed on a monocrystalline silicon layer (11). The channel layer (12) comprises an alloy of silicon and a second material with the second material substitutionally present in silicon lattice sites at an atomic percentage that places the channel layer (12) under a tensile stress.

17 Claims, 3 Drawing Sheets

ENHANCED MOBILITY MOSFET DEVICE AND METHOD

BACKGROUND OF THE INVENTION

This invention relates, in general, to semiconductor devices, and more particularly, to semiconductor devices having enhanced carrier mobility.

Metal oxide semiconductor field effect transistor (MOSFET) devices are well known and widely used in the electronics industry. The carrier mobility of a MOSFET device is an important parameter because of its direct influence on output current and switching performance. In standard MOSFET technology, the channel length and gate dielectric thickness are reduced to improve current drive and switching performance. However, reducing the gate dielectric thickness can compromise device performance because of the associated increase in intrinsic gate capacitance.

In silicon MOSFET devices, it has been shown that a buried channel region under compressive stress consisting of a silicon/germanium ($Si_{1-x}Ge_x$) alloy, bounded above and below by silicon regions, enhances hole carrier mobility in the channel region. This is because the holes are confined to the channel region by the potential energy offset between the surrounding silicon regions and the $Si_{1-x}Ge_x$ channel region. Such strained devices are shown in U.S. Pat. No. 5,241,197 issued to Murakami et al., and U.S. Pat. No. 5,019,882 issued to Solomon et al.

Buried $Si_{1-x}Ge_x$ channel devices have several disadvantages including increased alloy scattering in the channel region that degrades electron mobility, no favorable conduction band offset thus minimally enhanced electron mobility, no higher carrier velocities than silicon, and the need for large Ge concentrations to produce strain and thus enhanced mobility. Large Ge concentrations result in greatly reduced layer thicknesses and processing temperatures. The reduced processing temperatures adversely affect dopant activation and gate oxide processing.

Silicon devices with channel regions under a tensile stress are desirable because the tensile strain results in both hole and electron mobility enhancement and increased carrier velocity compared to silicon. One reported approach uses a strained silicon surface channel region with a relaxed $Si_{0.7}Ge_{0.3}$ alloy layer below the silicon channel region and a $Si_{1-x}Ge_x$ (X=5–30%) buffer layer below the $Si_{0.7}Ge_{0.3}$ alloy layer. One advantage of this approach is the elimination of alloy scattering in the channel region. However, this approach has a disadvantage in that the strained channel layer is at the surface and is thus susceptible to surface scattering effects that reduce mobility. It is also susceptible to hot carrier degradation and noise problems. In addition, the approach requires alloy relaxing and buffering layers, which increases process complexity and costs.

Another reported approach uses a strained $Si_{1-x}Ge_x$ channel layer formed on a relaxed $Si_{1-y}Ge_y$ layer (where Y>X) with a silicon layer above the strained $Si_{1-x}Ge_x$ channel layer and a silicon layer below the relaxed $Si_{1-y}Ge_y$ layer. This structure has several disadvantages including the migration of carriers out of the strained $Si_{1-x}Ge_x$ channel layer into the relaxed $Si_{1-y}Ge_y$ alloy layer thus reducing the enhanced mobility effect, greater alloy scattering effects because of the presence of germanium in the channel layer, and added process complexity because of multiple SiGe layers.

As is readily apparent, there exists a need for a MOSFET device that has enhanced electron and hole mobility, that is less susceptible to alloy scattering effects, that is less susceptible to surface scattering effects, and that does not require alloy relaxing and/or buffering layers.

SUMMARY OF THE INVENTION

Briefly stated, an enhanced mobility MOSFET device comprises a carrier transport region formed on a monocrystalline silicon layer of a first conductivity type. The carrier transport region comprises an alloy of silicon and a second material, wherein the second material is present in the carrier transport region at an atomic percentage such that the carrier transport region is under tensile stress. A source region and a drain region of a second conductivity type extend into the carrier transport region. A portion of the carrier transport region separates the source region and the drain region. A control electrode is electrically insulated from the carrier transport region and is disposed between the source region and the drain region.

A method for making an enhanced mobility MOSFET described herein comprises forming a carrier transport region on a first conductivity type monocrystalline silicon layer. The carrier transport layer comprises an alloy of silicon and a second material. The second material is present in the carrier transport region at an atomic percentage that places the carrier transport region under tensile stress. A gate dielectric layer is formed on a portion of the carrier transport region. A control electrode is formed on the gate dielectric layer. A source region and a drain region having a second conductivity type are formed such that they extend at least into the carrier transport region and the portion of the carrier transport region is between the source and drain regions.

DETAILED DESCRIPTION OF THE DRAWINGS

Figure 1:
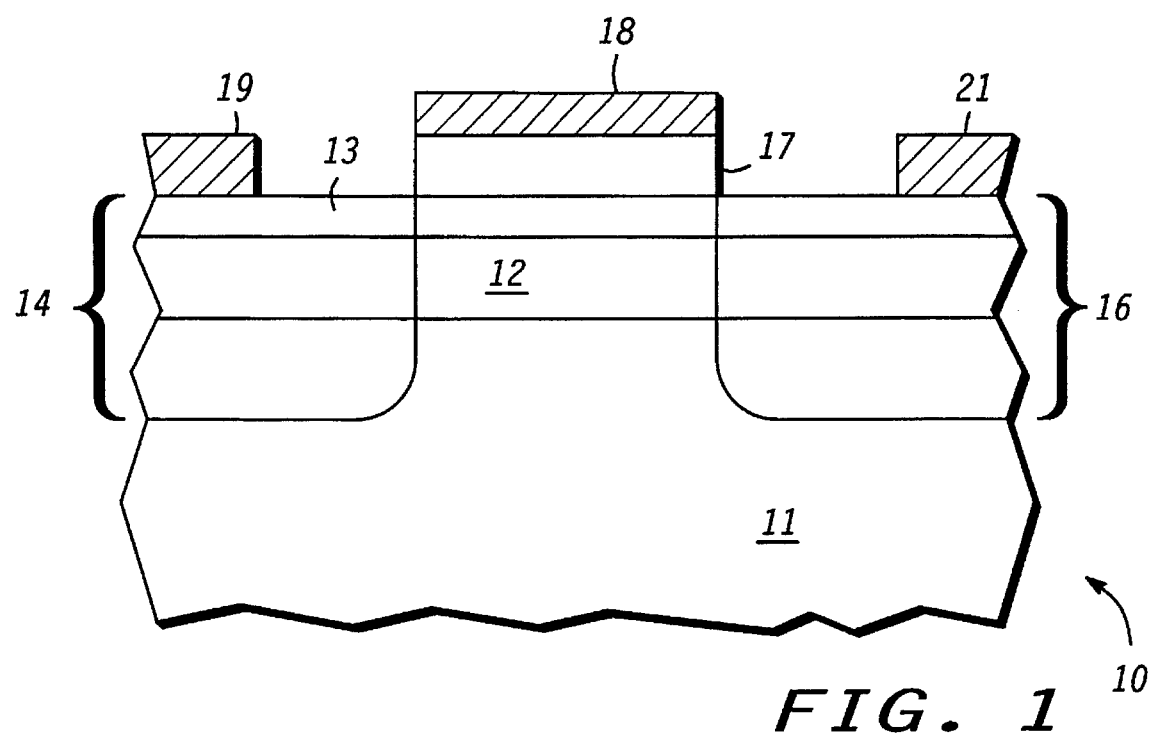
FIG. 1 is an enlarged sectional view of an embodiment of the present invention.

FIG. 1 illustrates an embodiment of a MOSFET device 10 having enhanced carrier mobility according to the present invention. Carrier transport region or channel layer 12 is formed on a monocrystalline silicon layer 11. Channel layer 12 comprises an alloy of silicon and a second material. Monocrystalline silicon layer 11 has an n-type conductivity for p-channel devices and a p-type conductivity for n-channel devices. The second material is substitutionally present in channel layer 12 lattice sites and is present at an atomic percentage such that channel layer 12 is under a tensile stress compared to monocrystalline silicon layer 11 or a crystal consisting of silicon. Preferably, channel layer 12 is not doped with acceptor or donor impurities.

MOSFET device 10 further comprises epitaxial semiconductor or epitaxial layer 13 formed over channel layer 12. Preferably, epitaxial layer 13 comprises silicon and is on the order of 50 angstroms thick. A source region 14 and a drain region 16 extend through epitaxial layer 13 and at least into channel layer 12. Preferably, source region 14 and drain region 16 extend through channel layer 12 into monocrystalline silicon layer 11. A portion of channel layer 12 is between source region 14 and drain region 16. A control or gate electrode 18 is electrically insulated from epitaxial layer 13. Preferably, gate electrode 18 is electrically insulated from epitaxial layer 13 with gate dielectric layer 17. Gate dielectric layer 17 preferably comprises an oxide and has a thickness in the range from 30 to 125 angstroms. A source electrode 19 is formed on a portion of source region 14 and a drain electrode 21 is formed on a portion of drain region 16.

Figure 2:
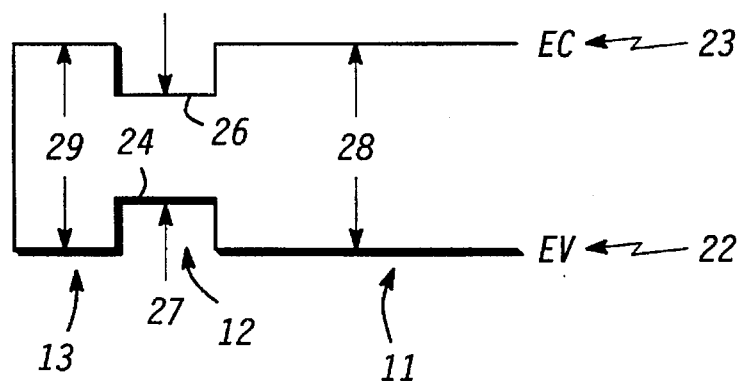
FIG. 2 is an energy band diagram of the embodiment of FIG. 1 under zero gate bias.

FIG. 2 is an energy band diagram of the embodiment of FIG. 1 under a zero gate bias and illustrates the effect of strain induced band splitting on channel layer 12. FIG. 2 shows the relative relationship between valence band 22 and conduction band 23 in epitaxial layer 13, channel layer 12, and monocrystalline silicon layer 11. When channel layer 12 is under tensile stress, valence band edge or interface 24 in channel layer 12 splits and in effect, moves up in energy level toward conduction band 23. In addition, conduction band edge or interface 26 splits and in effect, moves down in energy level toward valence band 22. This results in a channel layer bandgap 27 that is narrower than monocrystalline silicon layer bandgap 28 and epitaxial layer bandgap 29. The offset or narrowing of channel layer bandgap 27 in effect creates a potential well that traps holes and electrons within channel layer 12. Also, the above effect results in channel layer 12 having energy levels preferentially populated with holes and electrons with reduced effective carrier masses. This in turn enhances free carrier mobility in channel layer 12 when the appropriate gate bias is applied to gate electrode 18.

A channel layer under tensile stress is preferred over a channel layer under compressive stress because tensile stress provides greater conduction band splitting. In addition, lower effective carrier masses are predicted with films under tensile stress compared to films under compressive stress. Thus, a channel layer under tensile stress provides enhanced mobility for both electron and hole carriers and supports the fabrication of enhanced mobility complementary p-channel and n-channel devices.

As shown in U.S. Pat. No. 5,360,986, issued by J. Candelaria, hereby incorporated herein by reference, carbon-doped silicon is an alloy or material that is suitable for channel layer 12. In a preferred embodiment, channel layer 12 comprises a carbon-doped silicon or $Si_{1-x}C_x$ alloy where carbon is the second material, the carbon is present in substitutional silicon lattice sites, and X preferably is less than or equal to 0.02. Preferably, X is in the range of approximately 0.005 and 0.016.

Preferably, channel layer 12 has a thickness on the order of 100 to 200 angstroms when X is on the order of 0.02 to 0.005 respectively. The thickness of channel layer 12 is adjusted according to the atomic percentage of carbon present. When channel layer 12 comprises a $Si_{1-x}C_x$ alloy, epitaxial layer 13 preferably comprises silicon and has a thickness in the range from 50 to 100 angstroms.

A carbon-doped silicon channel layer is preferred over a germanium-doped silicon channel layer because a carbon-doped channel layer has a lower alloy/carrier scattering effect. This is because the relative size difference between carbon and germanium atoms allows one to use a much reduced (on the order of 11 to 1) amount of carbon compared to germanium to achieve similar strain magnitudes (although opposite in sign). Because a carbon-doped silicon channel layer has a reduced alloy/carrier scattering effect compared to a similarly strained germanium-doped silicon channel layer, carrier mobility, particularly electron mobility, is additionally enhanced. Furthermore, because channel layer 12 in MOSFET device 10 is buried, that is, bounded by epitaxial layer 13 and monocrystalline silicon layer 11, MOSFET device 10 is less susceptible to surface scattering, hot carrier degradation, and noise effects.

When channel layer 12 comprises a $Si_{1-x}C_x$ alloy, epitaxial growth or chemical vapor deposition techniques are used to form channel layer 12. An acetylene, ethylene, propane, or methane carbon source is used, for example. Alternatively, as shown in U.S. Pat. No. 5,360,986, a silicon layer is formed, carbon is ion implanted into the silicon layer, and the carbon-doped silicon layer is heated to induce solid phase epitaxial regrowth of the carbon-doped silicon layer to form channel layer 12. Alternatively, molecular beam epitaxy, metallo organic chemical vapor deposition (MOCVD), or ultra-high vacuum chemical vapor deposition (UHVCVD) is used to form channel layer 12.

In a preferred embodiment for forming MOSFET device 10 having a p-channel configuration and a carbon-doped channel layer, monocrystalline silicon layer 11 having an n-type conductivity is selectively formed on or in a p-type substrate. Channel layer 12 comprising carbon-doped silicon is then formed over the undoped silicon layer. Next, epitaxial layer 13 comprising either n-type doped or undoped silicon and having a thickness on the order of 50 to 100 angstroms is formed over channel layer 12. Preferably, the undoped silicon layer, channel layer 12, and epitaxial layer 13 are formed in a single epitaxial growth step.

A silicon oxide layer having a thickness in the range from 60 to 80 angstroms is then deposited or grown on epitaxial layer 13. Next, an in-situ doped n-type polysilicon layer is formed over the silicon oxide layer. The n-type polysilicon layer and the silicon oxide layer are then selectively patterned to form gate electrode 18 and gate dielectric layer 17 respectively. Next, p-type dopant is selectively incorporated into epitaxial layer 13. The structure is then heated to activate the p-type dopant to form source region 14 and drain region 16. Standard MOSFET processing is then used to complete MOSFET device 10. To form MOSFET device 10 in an n-channel configuration, the dopant conductivity types are reversed.

Figure 3:
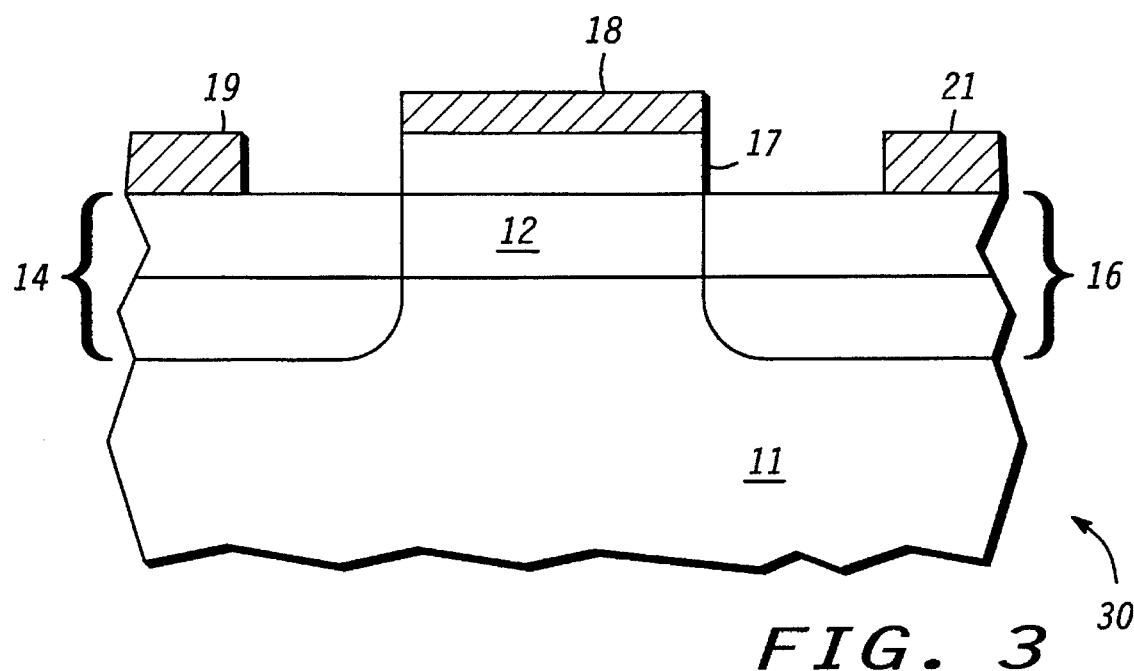
FIG. 3 is an enlarged sectional view of another embodiment of the present invention.
Figure 4:
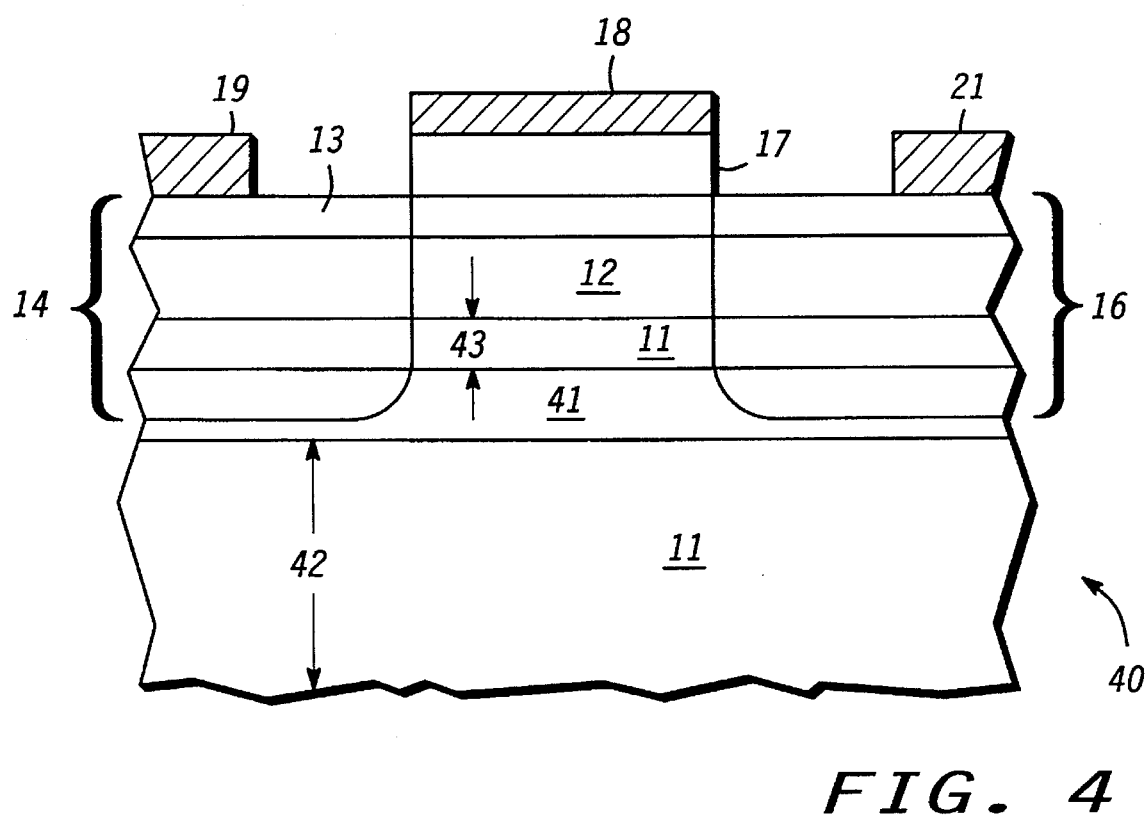
FIG. 4 is an enlarged sectional view of an additional embodiment of the present invention.
Figure 5:
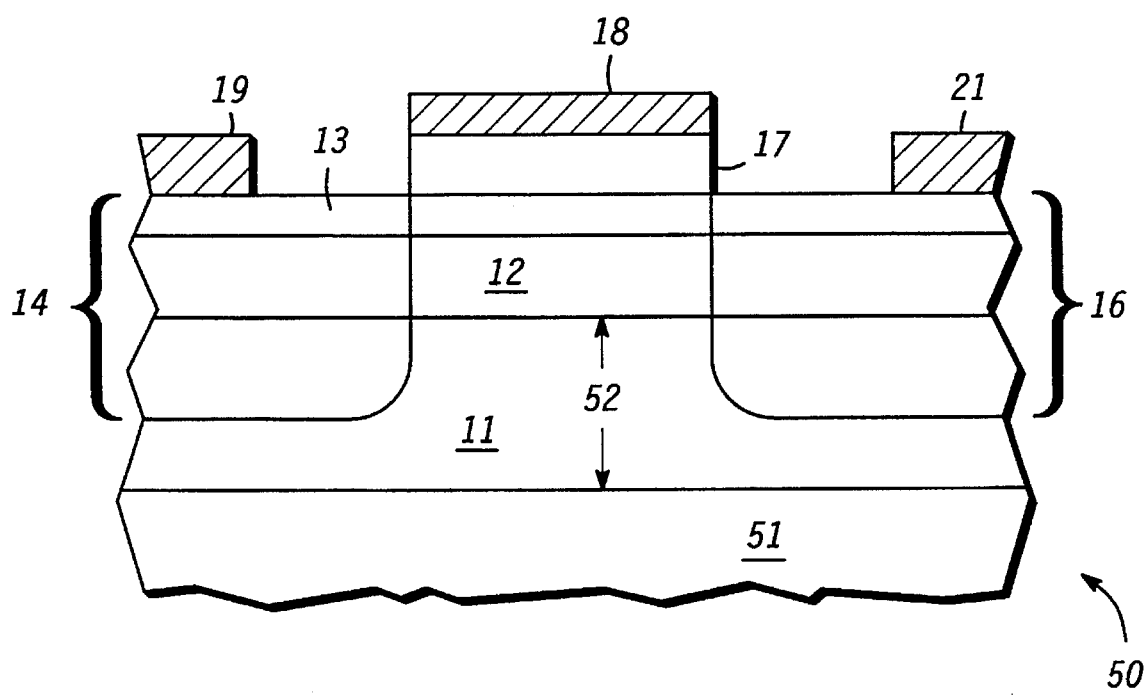
FIG. 5 is an enlarged sectional view of a further embodiment of the present invention.

FIGS. 3–5 illustrate alternative embodiments of an enhanced mobility MOSFET device according to the present invention. MOSFET device 30 shown in FIG. 3 is similar to MOSFET device 10 except MOSFET device 30 does not have epitaxial layer 13. MOSFET device 30 has an enhanced mobility as described above but is more susceptible to surface scattering effects because of the interface between channel layer 12 and gate dielectric layer 17. However, the carrier mobility of MOSFET device 30 is still enhanced when compared to a similarly constructed non-stressed silicon channel MOSFET device.

MOSFET device 40 shown in FIG. 4 is similar to MOSFET device 10 with the addition of modulation doping or modulation layer 41 formed within monocrystalline silicon layer 11. A portion 43 of monocrystalline silicon layer 11 separates modulation layer 41 from channel layer 12. Portion 43 preferably has a thickness on the order of 50 to 100 angstroms. Modulation layer 41 is of the same conductivity type as source region 14 and drain region 16. Modulation layer 41 has a higher dopant concentration than the dopant concentration of monocrystalline silicon layer 11 and is of an opposite conductivity type than monocrystalline silicon layer 11. Preferably, modulation layer 41 has a thickness in the range from 100 to 200 angstroms.

Modulation layer 41 is formed on portion 42 of monocrystalline silicon layer 11 using epitaxial growth or chemical vapor deposition (CVD) techniques. Portion 43 of monocrystalline silicon layer 11 is then formed on modulation layer 41 using epitaxial growth or CVD techniques. Portion 43 of monocrystalline silicon layer 11 can be doped n or p-type by using ion implantation and/or diffusion techniques, depending upon whether MOSFET device 40 is a p-channel or an n-channel device respectively. Preferably, modulation layer 41 and portion 43 of monocrystalline silicon layer 11 are formed sequentially in a single in-situ process sequence.

MOSFET device 50 shown in FIG. 5 is similar to MOSFET device 10 with the addition of insulating layer or region 51 to form a semiconductor-on-insulator (11111) device. Insulating layer 51 preferably comprises silicon oxide and is formed using oxygen ion implantation or other techniques. Insulating layer 51 preferably is formed before channel layer 12 and epitaxial layer 13 are formed. Alternatively, insulating layer 51 is formed on a supporting substrate (not shown), a monocrystalline silicon substrate is then bonded to insulating layer 51, and the monocrystalline silicon substrate is thinned to the desired thickness to form monocrystalline silicon layer 11. Preferably, insulating layer 51 is spaced a distance 52 of 500 to 600 angstroms from channel layer 12.

When insulating layer 51 is used with MOSFET device 30 (FIG. 3), insulating layer 51 preferably is spaced on the order of 1000 angstroms below channel layer 12. When insulating layer 51 is used with MOSFET device 40 (FIG. 4), insulating layer 51 preferably is spaced on the order of 100 to 200 angstroms below modulation layer 41.

By now it should be appreciated that there has been provided an enhanced mobility MOSFET device. By forming a carrier transport region on a monocrystalline silicon layer, where the carrier transport region comprises an alloy of silicon and a second material, and where the second material is present in the carrier transport region at an atomic percentage that places the carrier transport region under a tensile stress, enhanced carrier mobility is achieved.

Also, by placing the carrier transport region under tensile stress, greater conduction band splitting is achieved compared to a carrier transport region under compressive stress thus providing enhanced mobility for both electron and hole carriers. This supports the fabrication of enhanced mobility complementary n-channel and p-channel devices.

In addition, by adding an epitaxial layer over the carrier transport region, a buried structure is provided that is less susceptible to surface scattering, hot carrier degradation, and noise effects.

Furthermore, when the carrier transport region comprises carbon-doped silicon, reduced alloy scattering is achieved compared to similarly strained carrier regions comprising germanium-doped silicon. Also, when the carrier transport region comprises carbon-doped silicon, a carrier transport region under tensile stress is achieved without using a relaxed alloy layer. This reduces process complexity and costs.

I claim:

1. An enhanced mobility semiconductor device comprising:

a monocrystalline silicon layer of a first conductivity type;

a carrier transport region formed on the monocrystalline silicon layer, wherein the carrier transport region comprises an alloy of silicon and a second semiconductor material, and wherein the second semiconductor material is substitutionally present in the carrier transport region lattice sites at an atomic percentage such that the carrier transport region is under tensile stress, and wherein the carrier transport region has a bandgap narrower than the monocrystalline silicon layer;

a source region of a second conductivity type extending into the carrier transport region;

a drain region of the second conductivity type extending into the carrier transport region, wherein a portion of the carrier transport region is between the source region and the drain region; and a control electrode electrically insulated from the carrier transport region, wherein the control electrode is disposed between the source region and the drain region.

2. The device of claim 1 further comprising:

a silicon epitaxial layer disposed between the carrier transport region and the control electrode, wherein the source region and the drain region extend through the silicon epitaxial layer into at least the carrier transport region.

3. The device of claim 1 wherein the carrier transport region comprises a $Si_{1-x}C_x$ alloy.

4. The device of claim 3 wherein X is less than or equal to 0.02.

5. The device of claim 4 wherein X is in a range from approximately 0.005 to 0.016.

6. The device of claim 1 wherein the control electrode is separated from the carrier transport region by a silicon oxide layer.

7. The device of claim 1 further comprising:

an insulating layer disposed below the monocrystalline silicon layer.

8. The device of claim 1 wherein the source region and the drain region extend through the carrier transport region into the monocrystalline silicon layer.

9. The device of claim 1 wherein the monocrystalline silicon layer includes a modulation doping layer disposed within the monocrystalline silicon layer, wherein a portion of the monocrystalline silicon layer separates the modulation doping layer from the carrier transport region, and wherein the modulation doping layer is of the second conductivity type and has a dopant concentration higher than the monocrystalline silicon layer.

10. The device of claim 9 wherein the portion of the monocrystalline silicon layer that separates the modulation doping layer from the carrier transport region has a thickness on an order of 50 to 100 angstroms, and wherein the source region and the drain region extend into the modulation doping layer.

11. A MOSFET structure including:

a channel layer comprising a $Si_{1-x}C_x$ alloy formed on a monocrystalline silicon layer of a first conductivity type, wherein carbon is present in the channel layer in substitutional lattice sites so that the channel layer is under tensile stress, and wherein the channel layer has a bandgap narrower than the monocrystalline silicon layer;

an epitaxial silicon layer formed on the channel layer;

a source region of a second conductivity type extending through the epitaxial silicon layer and at least into the channel layer;

a drain region of the second conductivity type extending through the epitaxial silicon layer and at least into the channel layer, wherein part of the channel layer separates the source region from the drain region;

a gate dielectric layer formed on the epitaxial silicon layer at least between the source region and the drain region; and a gate electrode formed on the gate dielectric layer.

12. The structure of claim 11 wherein X is less than or equal to 0.02.

13. The structure of claim 12 wherein X is between 0.005 and 0.016.

14. The structure of claim 11 wherein the gate dielectric layer has a thickness in a range from 30 to 125 angstroms.

15. The structure of claim 11 further comprising an insulating region disposed below the monocrystalline silicon layer.

16. The structure of claim 11 wherein the monocrystalline silicon layer includes a modulation layer disposed within the monocrystalline silicon layer, wherein a portion of the monocrystalline silicon layer separates the modulation layer from the channel layer, and wherein the modulation layer is of the second conductivity type, and wherein the modulation layer has a dopant concentration that is higher than dopant concentration in the monocrystalline silicon layer.

17. The structure of claim 11 wherein the monocrystalline silicon layer has a thickness on an order of 1000 angstroms, the channel layer has a thickness on an order of 100 angstroms, and the epitaxial silicon layer has a thickness on an order of 50 angstroms.

* * * * *